United States Patent [19]

Murakami et al.

[11] Patent Number: 4,704,739
[45] Date of Patent: Nov. 3, 1987

[54] RECEIVING CIRCUIT FOR CONVERTING SIGNALS COMPRISING AT LEAST TWO FERROMAGNETIC RESONATORS

[75] Inventors: Yoshikazu Murakami, Kanagawa; Seigo Ito, Tokyo; Toshiro Yamada, Kawagawa, all of Japan

[73] Assignee: Sony Corporation, Tokyo, Japan

[21] Appl. No.: 740,899

[22] Filed: Jun. 3, 1985

[30] Foreign Application Priority Data

Jun. 5, 1984 [JP] Japan .................... 59-114794

[51] Int. Cl.$^4$ .............................................. H04B 1/26
[52] U.S. Cl. ....................................... 455/325; 455/327; 455/333; 455/315; 455/318; 331/117 D; 333/204
[58] Field of Search ............... 455/325, 327, 315, 318, 455/333, 326, 328, 189; 333/202, 204, 209; 331/117 D, 117 R, 3, 77, 116 FE, 117 FE

[56] References Cited

U.S. PATENT DOCUMENTS

| 3,879,677 | 4/1975 | Arnold | 331/77 |
| 3,889,213 | 6/1975 | Vittoria et al. | 333/209 |
| 3,939,429 | 2/1976 | Löhn et al. | 455/327 |
| 4,331,940 | 5/1982 | Uwano | 331/117 D |
| 4,333,062 | 6/1982 | Uwano | 331/117 D |
| 4,420,731 | 12/1983 | Schiebold et al. | 333/202 |
| 4,491,976 | 1/1985 | Saitoh et al. | 455/189 |
| 4,547,754 | 10/1985 | Murakami et al. | 333/204 |
| 4,553,264 | 11/1985 | Hasegawa et al. | 455/315 |
| 4,626,800 | 12/1986 | Murakami et al. | 331/117 D |

Primary Examiner—Jin F. Ng
Assistant Examiner—Elissa Seidenglanz
Attorney, Agent, or Firm—Hill, Van Santen, Steadman & Simpson

[57] ABSTRACT

A signal converter comprises a filter formed of a first ferromagnetic resonator which supplied with an input signal that is to be converted and produces a filtered signal having a first frequency, a local oscillator formed of an active element and a second ferromagnetic resonator connected to the active element, produces an oscillating signal having a second frequency, a mixer receives and mixes the filtered signal and oscillating signal and produces a converted signal, the first ferromagnetic resonator is formed of a first ferrimagnetic crystal, a microstrip line magnetically coupled to the ferrimagnetic crystal and a first D.C. bias magnetic field means which applies a first D.C. bias magnetic field to the first ferrimagnetic crystal, the second ferromagnetic resonator is formed of a second ferrimagnetic crystal, a second microstrip line is magnetically coupled to the second ferrimagnetic crystal, and a second D.C. bias magnetic field means which applies a second D.C. bias magnetic field to the second ferrimagnetic crystal. The first and second ferrimagnetic crystals are composed of ferrimagnetic thin films such as YIG film formed by a thin film forming technique, such as liquid phase epitaxial growth.

17 Claims, 35 Drawing Figures

RECEIVING CIRCUIT FOR CONVERTING SIGNALS COMPRISING AT LEAST TWO FERROMAGNETIC RESONATORS

BACKGROUND OF THE INVENTION

1. Field of the Invention

The present invention relates to a signal converter used in a tuning device for a radio receiver, a television receiver and the like.

2. Prior Art

A ferromagnetic resonator, for example, a YIG (YIG in the specification including yttrium iron garnet together with various additives) resonator using YIG as a ferromagnetic resonance element, is advantageous in that Q of resonance characteristics is high in the microwave band and compact construction is possible because the resonance frequency is not varied by the volume of the YIG element, and the resonance frequency can be varied linearly over a wide band region by varying the bias magnetic field applied to the element. Consequently, in recent years, in a receiver of high frequency signal such as microwave, a magnetic resonance element of YIG monocrystalline sphere or a YIG monocrystalline plate has been used as a resonance circuit for a tuning circuit. Such construction is proposed in Japanese unexamined patent applications laid-open No. 137609/1975, No. 78201/1975, No. 60402/1974 and No. 71215/1975.

When a signal converter for a tuning circuit is composed of a filter circuit and a local oscillator using a YIG resonator, the filter circuit and the local oscillator must have coincident resonance characteristics. If the YIG monocrystalline sphere or plate is used, however, it cannot be manufactured uniformly and precisely in the shape and size and dispersion is apt to occur in its characteristics. Consequently, the resonance characteristics are not coincident between the filter circuit and the local oscillator and therefore tracking errors may occur. In order to correct such errors, a special circuit construction such as disclosed in the patent application laid-open No. 137609/1975 is required and thus the whole circuit construction becomes complicated.

OBJECT AND SUMMARY OF THE INVENTION

It is an object of the present invention to provide an improved signal converter using ferromagnetic resonance.

It is another object of the present invention to provide an improved signal converter useful in a tuning device.

It is further object of the present invention to provide a signal converter having a simple construction and which is suitable or making in a small size.

It is still further object of the present invention to provide a signal converter which is improved in temperature stability.

According to one aspect of the present invention there is provided a signal converter which comprises a filter formed of a first ferromagnetic resonator supplied with an input signal to be converted and deriving a filtered signal having a first frequency, a local oscillator formed of an active element and a second ferromagnetic resonator connected to said active element, deriving an oscillating signal having a second frequency, a mixer mixing said filtered signal and said oscillating signal and deriving a converted signal, said first ferromagnetic resonator being formed of a first ferrimagnetic crystal, a microstrip line magnetically coupled to said ferrimagnetic crystal and first D.C. bias magnetic field means applying a first D.C. bias magnetic field to said first ferrimagnetic crystal, said second ferromagnetic resonator being formed of a second ferrimagnetic crystal, a microstrip line magnetically coupled to said second ferrimagnetic crystal, and second D.C. bias magnetic field means applying a second D.C. bias magnetic field to said second ferrimagnetic crystal, said first and second ferrimagnetic crystals being composed of ferrimagnetic thin films formed by a thin film forming technique.

According to another aspect of the present invention there is provided a signal converter comprising a first local oscillator formed of a first active element and a first ferromagnetic resonator connected to said first active element, deriving a first oscillating signal having a first frequency, a first mixer mixing said first oscillating signal and an input signal to be converted and deriving a mixed signal, a filter formed of a second ferromagnetic resonator supplied with said mixed signal and deriving a filtered signal having a second frequency, a second local oscillator formed of a second active element and a third ferromagnetic resonator connected to said second active element and deriving a second oscillating signal having a third frequency, a second mixer mixing said filtered signal and said second oscillating signal and deriving a converted signal, said first ferromagnetic resonator being formed of a first ferrimagnetic crystal, a microstrip line magnetically coupled to said ferrimagnetic crystal and first D.C. bias magnetic field means applying a first D.C. bias magnetic field to said first ferrimagnetic crystal, said second ferromagnetic resonator being formed of a second ferrimagnetic crystal, a microstrip line magnetically coupled to said second ferrimagnetic crystal and second D.C. bias magnetic field means applying a second D.C. bias magnetic field to said second ferrimagnetic crystal, said third ferromagnetic resonator being formed of a third ferrimagnetic crystal, a microstrip line magnetically coupled to said third ferrimagnetic crystal and third D.C. bias magnetic field means applying a third D.C. bias magnetic field to said third ferrimagnetic crystal, said first, second, and third ferrimagnetic crystals being composed of ferrimagnetic thin films formed by a thin film forming technique.

DESCRIPTION OF THE PREFERRED EMBODIMENTS

Figure 1:
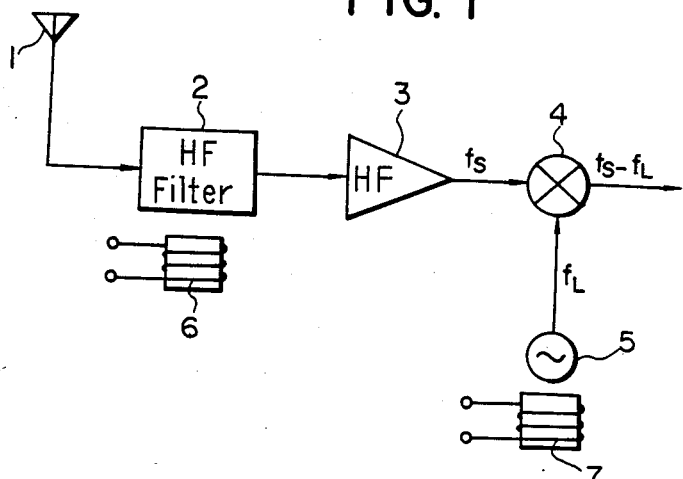
FIG. 1 is a block diagram of a receiver as an embodiment of the invention.

A signal converter as an embodiment of the invention will now be described referring to FIG. 1. The embodiment is of superhetorodyne type, and comprises an antenna 1, a high-frequency filter circuit 2 using a ferromagnetic resonator such as a YIG resonator, a high-frequency amplifier 3, a mixer 4, a local oscillator 5 including a resonator using ferromagnetic resonator such as YIG resonator, and magnetic field applying means 6 and 7 which supply variable magnetic fields to the YIG resonator elements in the filter circuit 2 and the local oscillator 5, respectively. Both means 6 and 7 may be adjusted in interlocking relationship. The resonance frequency of the YIG element in the filter circuit 2 is adjusted by the means 6, thereby selection of the pass band center frequency in the filter circuit 2, that is, selection of tuning frequency or tuning action is effected. In this case, the signal received from the antenna 1 is introduced to the YIG filter circuit 2, and the signal of frequency $f_S$ passing through the filter circuit 2 is amplified by the high-frequency amplifier 3 and then introduced to the mixer 4 and mixed with the local oscillation signal of frequency $f_L$ from the local oscillator 5, and the signal of intermediate frequency $f_S-f_L$ is taken out from the mixer 4.

In the invention, the YIG filter circuit 2 and the YIG resonator of the local oscillator 5 specially constructed.

The magnetic resonance element is formed on a common paramagnetic substrate such as GGG (gadolinium.gallium.garnet) substrate by means of a thin film forming method, such as sputtering, chemical vapor deposition (CVD) or liquid phase epitaxy (LPE), into a ferrimagnetic thin film, e.g. YIG thin film. The YIG thin film is patterned by photolithography thereby both YIG thin film magnetic resonance elements are simultaneously formed on the common GGG substrate. In this case the YIG thin film elements which constitute the YIG filter circuit 2 and the YIG resonator of the local oscillator 5 respectively have the same shape, such as disk, square or rectangular shape. The difference of resonance frequencies, that is, the offset frequency can be set by selecting the aspect ratio of each YIG thin film element, for example the, ratio of the film thickness to the diameter in the case of a disk shape device. If both YIG thin film elements are formed by the same film, in the case of disk shape, the offset frequency is set by selecting different diameters of both elements. For example, if saturated magnetization $4\pi m_s$ of YIG is $4\pi M_s = 1780$ Gauss and the film thickness t is 20 μm and the diameters are selected to 4 mm and 2 mm, respectively, the aspect ratio becomes 0.005 and 0.01 and the offset frequency becomes 56 MHz. Both elements are disposed in the same magnetic field. For example, both magnetic field generating means 6 and 7 in FIG. 1 may be formed commonly. Or both elements may be selected to be the same shape and size and hence have the same aspect ratio, and one element may be supplied with a magnetic field which is different from that of the other element by a definite amount so as to set a required offset frequency.

Both resonance elements of YIG thin film are provided by the same thin film element in the above embodiment. When the YIG thin film is formed on the substrate by means of a thin film forming method such as CVD, LPE or sputtering, the film thickness can be obtained uniformly and precisely. Consequently, even when both YIG thin film resonance elements are formed on separate substrates by the same or different processes, the resonance frequency can be set accurately without dispersion in comparison to the case where the YIG monocrystalline substance such as a YIG sphere or a YIG monocrystalline plate is machined by cutting or polishing so as to obtain a YIG magnetic resonance element.

Figure 2:
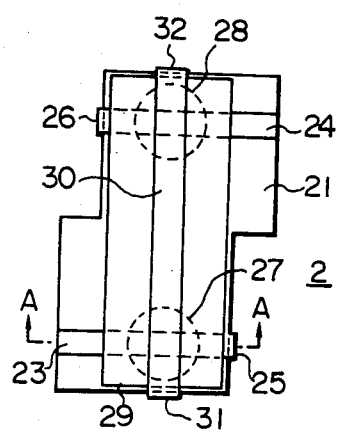
FIG. 2 is a plan view of YIG filter.
Figure 3:
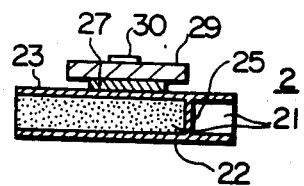
FIG. 3 is a sectional view taken in line A—A of FIG. 2.

An example of independent construction of a filter circuit 2 and a local oscillator 5 will be described. FIG. 2 shows a plan view of an example of structure of the filter circuit 2, and FIG. 3 shows a sectional view thereof. In this example, a first major surface of a dielectric substrate 21 of alumina or the like has a ground conductor 22 adhered thereon, and a second major surface has first and second micro strip lines in parallel to each other, i.e. input and output transmission lines 23 and 24 adhered thereon. Ends of both strip lines 23 and 24 are connected to the ground conductor 22 through first and second connecting conductors 25 and 26, respectively. First and second YIG thin film magnetic resonance elements 27 and 28 are disposed on the second major surface of the substrate 21 in electromagnetic coupling with the first and second micro strip lines 23 and 24, respectively. The first and second magnetic resonance elements 27 and 28 are constructed by a process wherein a YIG thin film is formed on a major surface of GGG substrate 29 by the thin film forming method and then patterned in disk shape by using photolithography techniques including selective etching. A third microstripline, i.e. coupling transmission line 30 is formed between the first and second magnetic resonance elements 27 and 28 on the substrate 29 so as to couple these element electromagnetically and it adheres to another surface of the substrate 29. Both ends of the third strip line 30 are connected to the ground conductor 22 through connecting conductors 31 and 32, respectively. The distance between both elements 27 and 28 is selected to λ/4 wherein λ is the wave length of the center frequency in the pass band so that insertion loss in the cutoff region outside the pass band is sharply increased.

Figure 4:
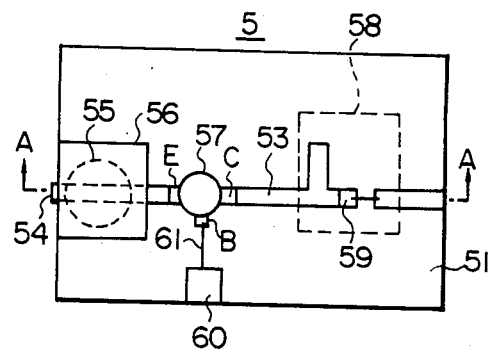
FIG. 4 is a plan view of a local oscillator.
Figure 5:
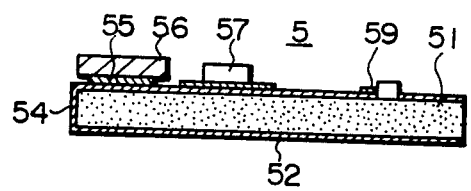
FIG. 5 is a sectional view taken in line A—A of FIG. 4.

On the other hand, FIG. 4 shows an example of a structure of the local oscillator 5, and FIG. 5 shows a sectional view taken on line A—A of FIG. 4. A first major surface of a dielectric substrate 51 of alumina or the like has a ground conductor 52 adhered thereon, and a second major surface has a microstripline 53 adhered thereon. One end of the microstripline 53 is connected to the ground conductor 52 through a connecting conductor 54. A YIG thin film magnetic resonance element 55 is electromagnetically coupled to the microstripline 53. The YIG thin film magnetic resonance element 55 is formed by a process wherein a YIG thin film is formed on a major surface of GGG substrate 56 by the thin film forming method and then patterned into a disk shape by photolithography. Numeral 57 designates a high-frequency bipolar transistor, numeral 58 an impedance converter, and numeral 59 a MOS capacitor for blocking D.C. components. In this example, the base B of the transistor 57 is connected through a wire 61 to a ground pad 60 in turn connected to the ground conductor 52, the emitter E is connected to the side of the element 55, and collector C is connected to the side of the impedance converter 58, thereby a series feedback type oscillator utilizing common base transister is constructed.

Figure 6A:
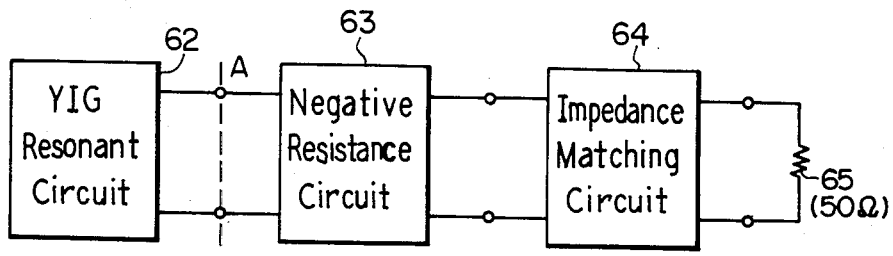
FIGS. 6a and 6b is a block diagram of an oscillator.
Figure 6B:
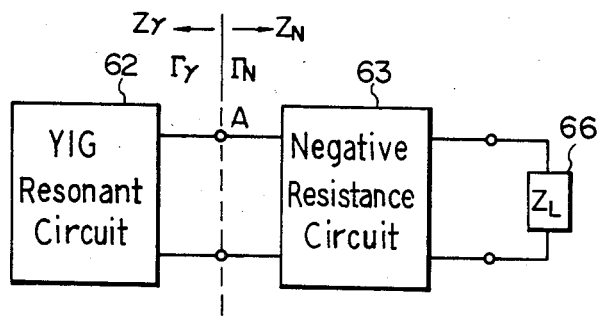

Next the, oscillation principle and condition for the oscillation will be described in connection with the circuit using the magnetic resonance element as a resonator. The resonator, i.e. YIG magnetic resonance element 55 is inserted into the feedback circuit other than into the output circuit. FIG. 6a and FIG. 6b are block diagrams of the oscillating circuit. Numeral 62 designates the YIG resonant circuit, numeral 63 a negative resistance circuit, numeral 64 an impedance matching circuit, and numeral 65 a load. Numeral 66 in FIG. 6-b designates load impedance including the impedance matching circuit.

In FIG. 6, the reflection coefficient $\Gamma_Y$ at a side of the YIG resonance circuit as viewed from terminal A, i.e. the side of the YIG feedback circuit, and the reflection coefficient $\Gamma_N$ at a side of the active element, i.e. the side of the negative resistance circuit, are expressed by the following formulae using respective impedances $Z_Y$ and $Z_N$ viewing from the terminal A.

$$\Gamma_Y = \frac{Z_Y - Z_O}{Z_Y + Z_O} \quad (1)$$

$$\Gamma_N = \frac{Z_N - Z_O}{Z_N + Z_O} \quad (2)$$

wherein $Z_O$: is characteristic impedance (50ω).

The condition of steady oscillation is expressed by the following formula using $\Gamma_Y$ and $\Gamma_N$.

$$\Gamma_Y \Gamma_N = 1 \quad (3)$$

Since both $\Gamma_Y$ and $\Gamma_N$ are complex numbers, formula (3) by separating the amplitude and phase components becomes as follows:

$$|\Gamma_Y||\Gamma_N|e^{j(\theta_Y+\theta_N)} = 1$$

hence $$|\Gamma_Y||\Gamma_N| = 1 \quad (4)$$

$$\theta_Y + \theta_N = 0 \quad (5)$$

Since the YIG feedback circuit is a passive element circuit it has positive real resistance is a loss component of the YIG resonator and, it follows from formula (1) that $|\Gamma_Y| < 1$. Consequently, in order to satisfy the oscillation the condition of formula (4), condition $|\Gamma_Y| >$ is required and it follows from formula (2) that $Z_n$ must have negative real resistance.

Figure 7:
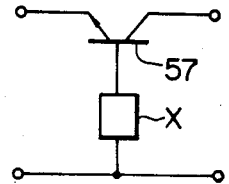
FIG. 7 is a diagram of circuit constitution of the oscillator.

The negative feedback circuit in FIG. 6 may be a two-terminaL active element of negative resistance or a circuit composed of three-terminal active element and feedback element. The example described in FIG. 4 and FIG. 5 uses a high-frequency bipolar transistor. FIG. 7 shows construction of a series feedback type oscillating circuit utilizing a common base transistor, and X designates a reactive circuit.

The above description of the oscillating circuit relates to steady oscillation. In order that the oscillation rises, however, the following condition must be satisfied.

$$|\Gamma_Y||\Gamma_{NS}| > 1 \quad (6)$$

hence $$|\Gamma_Y| > \frac{1}{|\Gamma_{NS}|} \quad (7)$$

Wherein $\Gamma_{Ns}$ is the value of $\Gamma_N$ at small signal levels. If the oscillation rises and the active element performs large amplitude operations, the absolute value of the negative resistance decreases and value the $1/|\Gamma_N|$ gradually increases and the oscillation becomes steady when the formula (2) is satisfied.

Based on the above conditions, the operation principle of the YIG oscillating circuit will be described referring to the Smith chart in FIG. 8. At small signal state, value $1/\Gamma_N$ is at C state shown at the relatively inner side of the Smith chart. However, as the active element performs large amplitude operation, $1/\Gamma_N$ passes through the D state and is transferred in the direction shown by the arrow.

Figure 8:
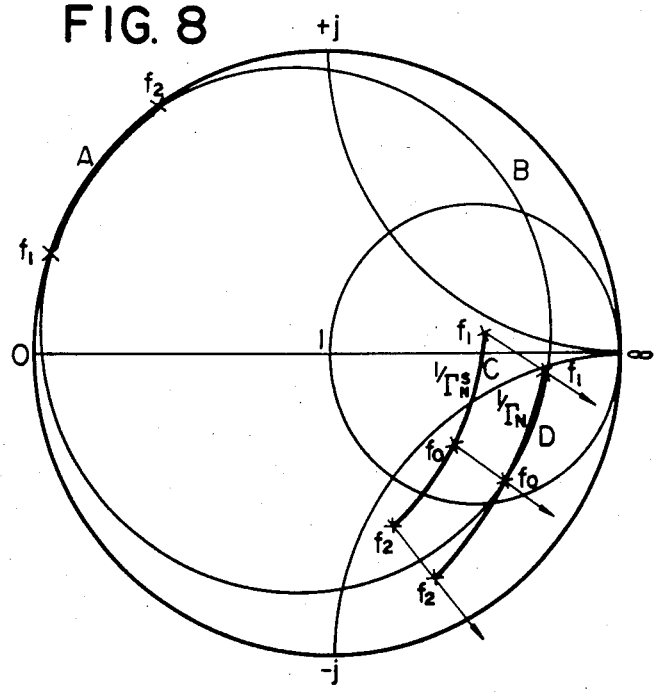
FIG. 8 is Smith chart illustrating oscillation action.

In the construction according to FIG. 4 and FIG. 5, if the YIG element 55 is not in resonance, the YIG oscillating circuit becomes only a strip line with the front end shortcircuited and therefore $\Gamma_Y$ follows the locus shown by A in FIG. 8. As clearly seen from FIG. 8, since the phase condition of oscillation shown by formula (5) is not satisfied by $\Gamma_N$ at any amplitude, oscillation does not occur.

If the YIG element 55 resonates at a frequency $f_0$ between $f_1$ and $f_2$ by application of d.c. magnetic field, y follows the locus shown by B in FIG. 8 at a frequency near $f_0$. Then, at a frequency near $f_0$, the amplitude condition of formula (7) for the oscillation to rise and the phase condition of formula (5) are satisfied simultaneously. If the oscillation rises and $1/\Gamma_N$ is transferred from C state to D state, since formulae (4) and (5) are simultaneously satisfied at frequency $f_0$, steady oscillation is effected at the oscillation frequency $f_0$.

Based on such principle, if the d.c. applied magnetic field is varied and the resonance frequency of the YIG element is varied between $f_1$ and $f_2$, the oscillating circuit oscillates and is tuned to a frequency near the resonance frequency.

Figure 9:
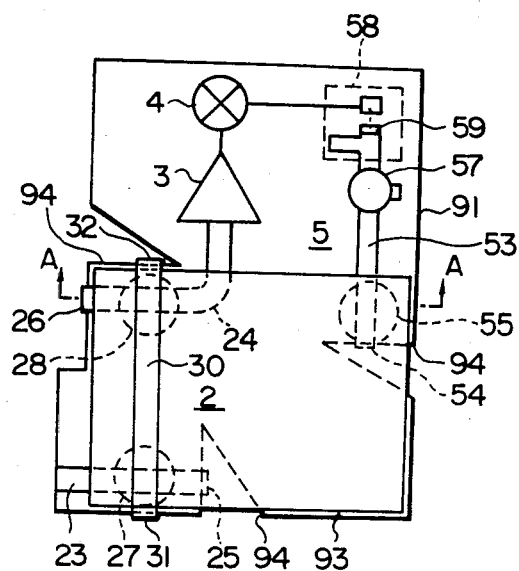
FIG. 9 is a plan view of a receiver as an example.
Figure 10:
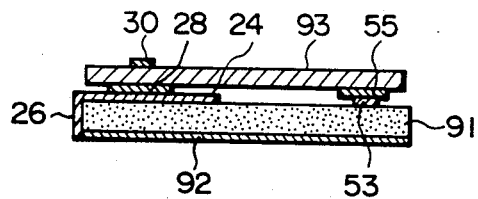
FIG. 10 is a sectional view taken in line A—A of FIG. 9.

In an example of FIGS. 2 and 3 and an example of FIGS. 4 and 5, the filter circuit 2 and the local oscillator 5 are formed on the separate substrates 21 and 51. However, the signal converter as a whole may be formed integrally on a single substrate. An example of such construction is shown in FIG. 9 and FIG. 10. FIG. 9 is a plan view of a signal converter, and FIG. 10 is a sectional view taken on line A—A of FIG. 9. Parts in FIG. 9 and FIG. 10 corresponding to FIG. 1 through FIG. 5 are designated by the same reference numerals, and the repeated description shall be omitted. In this case, the above-mentioned substrates 21 and 51 are replaced by a common substrate 91 made of alumina, for example. One major surface of the common substrate 91 has a filter circuit 2, an amplifier 3, a mixer 4 and a local oscillator 5 formed thereon, and another major surface has a common ground conductor 92 adhered thereon in place of the ground conductors 22 and 52. The GGG substrates 29 and 56 are replaced by a common GGG substrate 93, and YIG thin film elements 27, 28 and 55 are formed on the substrate 93. In a notch 94 provided on the substrate 91, ends of micro strip lines 23, 24 and 53 are connected to the ground conductor 92 through connecting conductors 25, 32 and 54, respectively.

The GGG substrate may be provided with recesses corresponding to the shape and size of various YIG thin film elements, and the YIG thin film elements may be disposed in respective recesses.

Figure 11:
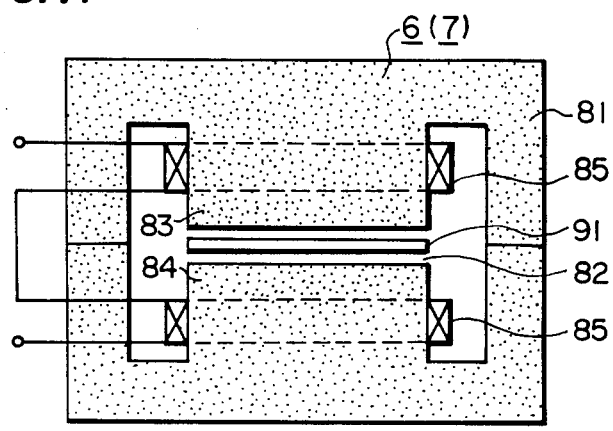
FIG. 11 through FIG. 13 are sectional views of magnetic field applying means.
Figure 12:
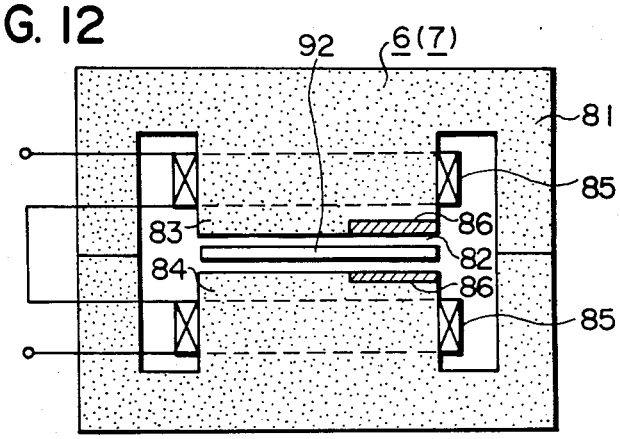
Figure 13:
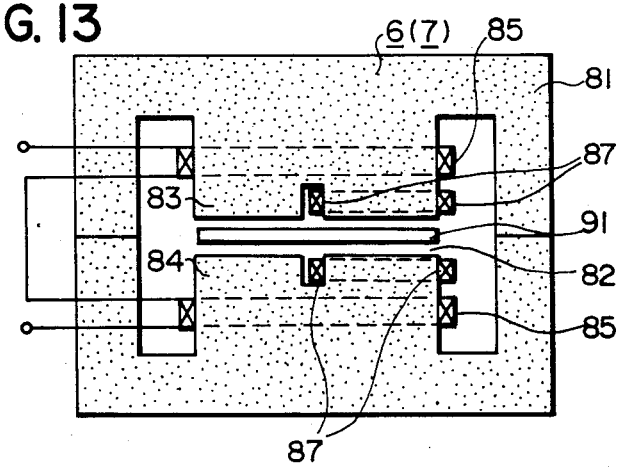

Although a magnetic field may be applied to the YIG thin film magnetic resonance elements 27, 28 and 55 of the filter circuit 2 and the local oscillator 5 by respective magnetic field applying means 6 and 7 as above described, the means 6 and 7 may be constructed. For example, a yoke 81 of magnetic substance such as permalloy is installed as shown in FIG. 11, and in a magnetic gap 82 of the yoke 81 is disposed a substrate 91 on which the signal converter circuit as described in FIG. 9 and FIG. 10 is assembled. A coil 85 is wound on at least one of the opposite magnetic poles 83 and 84 to constitute the magnetic gap 82 of the yoke 81, and the magnetic field applying means 6 and 7 are commonly formed. Thus, the common magnetic field is applied to the YIG thin film elements 27, 28 and 55 of the filter circuit 2 and the local oscillator 5. This construction can be applied to the case where the offset frequency is obtained by varying the aspect ratio in the YIG elements 27, 28 and 55. When different magnetic fields are applied to the YIG elements 27, 28 and 55 so as to obtain the offset frequency, as shown in FIG. 12 and FIG. 13, a permanent magnet 86 is locally arranged on at least one of the magnetic poles 83 and 84, or an auxiliary coil 87 is arranged there. Magnetic field from the magnet 86 or the coil 87 is superposed on the magnetic field from the coil 85 in the forward direction or the reverse direction so that in the magnetic gap 82 the magnetic field intensity at the installation position of the magnet 86 or the coil 87 is different from that at other positions by a prescribed amount, and the YIG elements 27, 28 of the filter circuit and the YIG element 55 of the local oscillator are arranged at positions different in the magnetic field intensity.

When the offset frequency is varied thereby the intermediate frequency to be taken out from the mixer 4 is varied as in a receiver used in amateur radio communication and, current flowing through the auxiliary coil 87, for example, may be adjusted so as to adjust the difference between the magnetic fields applied to respective YIG elements of the filter circuit and the local oscillator.

Figure 14:
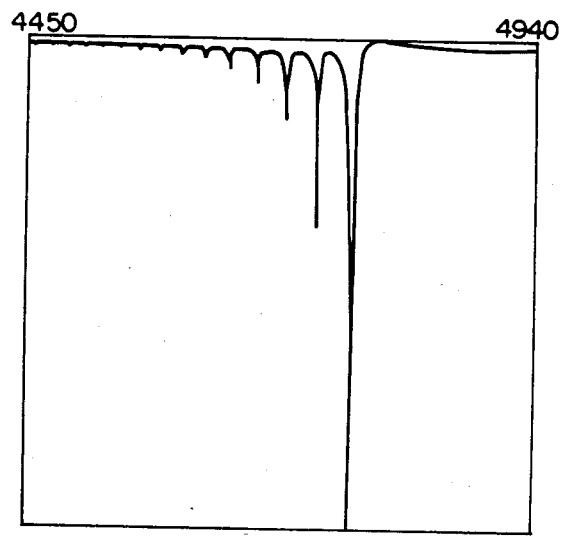
FIG. 14 is a graph illustrating magnetostatic mode generated in a circular ferrimagnetic thin film.

In the invention as above described, each resonator of the filter circuit 2 and the local oscillator 4 is constituted by a thin film element produced in a thin film forming method as a magnetic resonance element. The suppression of spurious response (magnetostatic mode) is required in this case. The magnetic resonance element by monocrystalline sphere (YIG monocrystalline sphere) is advantageous in that magnetostatic mode is not easily excited the single resonance mode of uniform precessional mode is obtained. However, even if the YIG thin film is located in the high-frequency magnetic field of good uniformity, since the internal d.c. magnetic field is not uniform, magnetostatic mode may be greatly excited. The magnetostatic mode when a d.c. magnetic field is applied perpendicularly to the surface of a ferrimagnetic specimen of disk shape is analyzed in the reference (Journal of Applied Physics, vol. 48, July 1977, pp. 3001–3007), and each mode is expressed by $(n, N)_m$. Wherein mode $(n, N)_m$ is a mode having n nodes in the circumferential direction, N nodes in the diameter direction, and (m-1) nodes in the thickness direction. If the high-frequency magnetic field has good uniformity throughout the specimen, $(1, N)_1$ series becomes the principal magnetostatic mode. FIG. 14 shows measured results of ferrimagnetic resonance of a circular YIG thin film specimen measured in a cavity resonator of 9 GHz. It is seen from the figure that the magnetostatic mode of $(1, N)_1$ series is greatly excited. When a microwave element such as a filter is constituted using the specimen, mode $(1, 1)_1$ the main resonance modes is utilized and other magnetostatic mode entirely becomes spurious responses, thereby signals of undesired frequencies may be passed or the S/N ratio may be reduced. In the local oscillator 5, the oscillation in the undesired frequency and may cause the shift of the intermediate frequency from the mixer 4. Consequently, in each ferrimagnetic thin film (YIG thin film magnetic resonance element), it is required that the excitation of the magnetostatic mode which are spurious response must be suppressed without deteriorating the main response mode. The means for such suppression will now be described.

Figure 15:
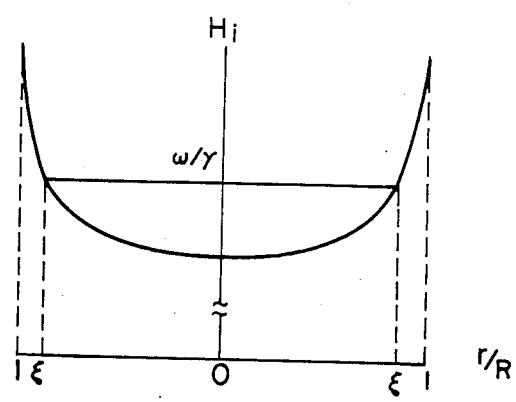
FIG. 15 is a graph illustrating distribution of internal d.c. magnetic field of the circular ferrimagnetic thin film.
Figure 16:
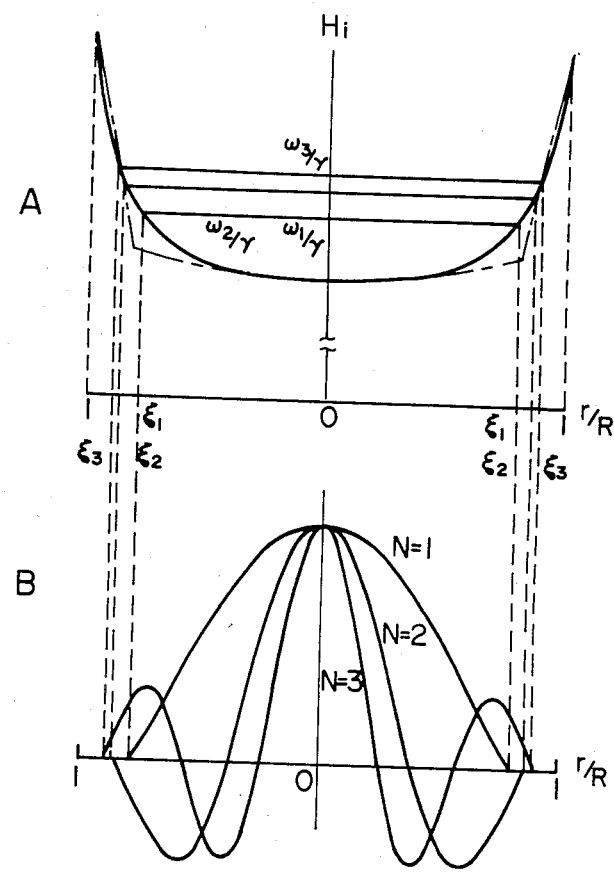
FIG. 16 is a graph illustrating relation between distribution of the internal d.c. magnetic field and the magnetostatic mode in the circular ferrimagnetic thin film.

FIG. 15 shows the state of the internal d.c. magnetic field Hi when a d.c. magnetic field is applied in the perpendicular direction to the surface of a disk shaped YIG thin film with a thickness t and a diameter D (radius r). Wherein the aspect ratio t/D is sufficiently small to neglect distribution of the magnetic field in the specimen thickness direction. Since the demagnetizing field is large at the inside of the disk and abruptly becomes small at the periphery the internal d.c. magnetic field is small at a portion near the center and abruptly becomes large near the periphery. According to the analysis result in the reference, if value of r/R at the position of $Hi = \omega/Y$ is assumed to be $\xi$, the magnetostatic mode exists at region where $0 \leq r/R \leq \xi$. Wherein $\omega$: is the resonant angular frequency of magnetostatic mode, Y: is the gyromagnetic ratio. When the magnetic field is fixed, as the mode number N becomes large, the resonance frequency becomes high and the region of magnetostatic mode expands outwards as shown in FIG. 16A. FIG. 16B shows the distribution of the RF magnetization within the specimen in low-order three modes of $(1, N)_1$ modes, and absolute value represents the amount of RF magnetization and the sign represents the phase relation of RF magnetization. As clearly understood from FIG. 16, the RF magnetization component has different forms depending on the magnetostatic mode. Utilizing this, excitation of magnetostatic mode becomes spurious response which can be suppressed without a significant effect on the major resonance mode.

Figure 17:
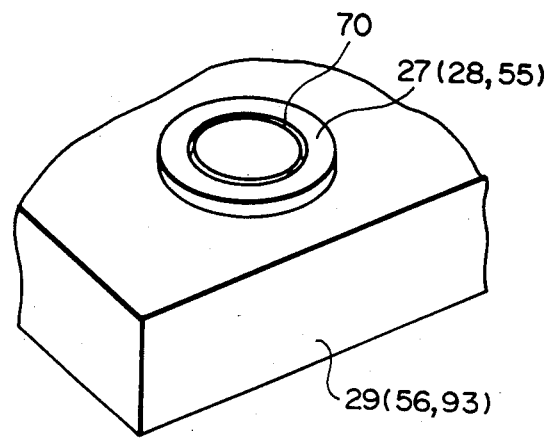
FIG. 17 is a perspective view of a magnetic resonance element.

More specifically, as shown in FIG. 17, YIG the thin film element 27, 28 or 55 of circular shape is formed on the GGG substrate 29, 56 or 93, and an annular groove 70 is formed on the thin film element by means of selective etching, for example, so as to form an annular thin portion. In this case, each YIG thin film element is sufficiently thin and the magnetostatic mode is $(1, N)_1$ mode.

Figure 18:
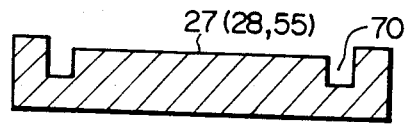
FIG. 18 is a sectional view of the magnetic resonance element.

The groove 70 is formed in concentric relation at a position where RF magnetization of $(1, 1)_1$ mode becomes zero. The groove as a whole may be continuous or discontinuous. As shown in FIG. 18, the region enclosed by the groove 70 may be made thin in comparison to the outside region. In this case the, demagnetizing field is elevated at the inside region close to the groove 70, and becomes nearly uniform in this region. In other words, the internal d.c. magnetic field becomes nearly uniform throughout a wide region in the radial direction as shown in dash-and-dot line of FIG. 16A. Consequently, the excitation of the magnetostatic mode other than the main resonance mode can be further suppressed.

In such a magnetic resonance element, the magnetization is restricted by the groove 70. Since the groove 70 exists at a position where the RF magnetization becomes zero to $(1, 1)_1$ mode, the excitation of $(1, 1)_1$ mode is not affected. On the contrary, since the RF magnetization to other modes is not essentially zero at the position of the groove 70, the magnetization is partially accelerated thereby excitation of such mode is reduced. Consequently, the spurious response can be suppressed without deteriorating the main resonance mode.

Since distribution of RF magnetization in the YIG thin film (refer to FIG. 16B) has no relation to the amount of saturated magnetization of the specimen and is not largely dependent on the aspect ratio, even if the saturated magnetization or the film thickness of the ferrimagnetic layer is different, the position of the groove need not be varied corresponding to the difference.

Figure 19:
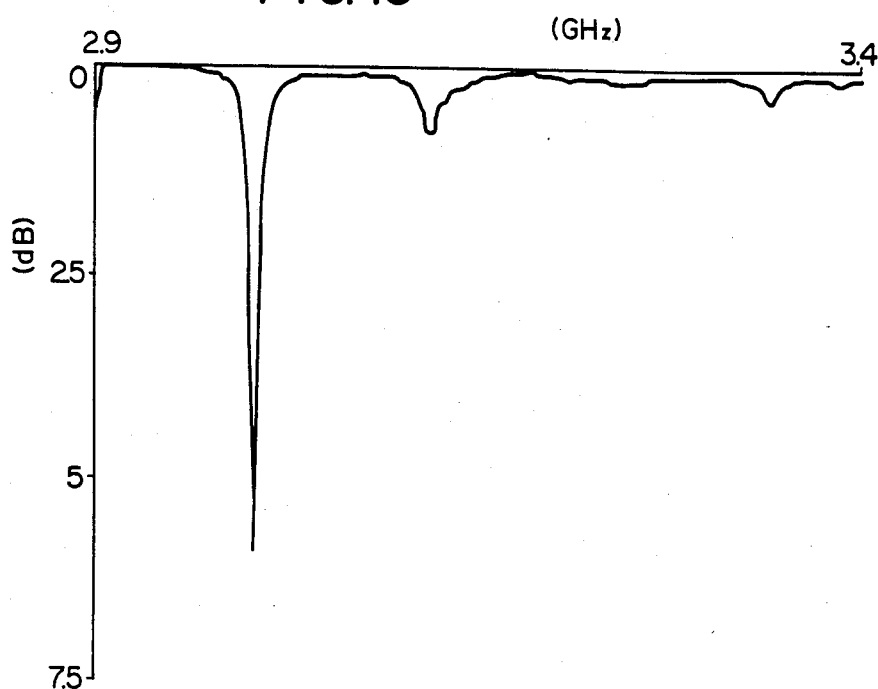
FIG. 19 is a graph illustrating insertion loss in the magnetic resonance element.

In this connection, the YIG thin film element of film thickness 20 μm and radius 1 mm was produced from a YIG thin film and a groove 70 of depth 2 μm was formed at position of radius 0.8 mm of the element, and the ferromagnetic resonance regarding the specimen was measured using micro strip lines, thereby measuring results of the insertion loss were obtained as shown in FIG. 19. The unloaded Q value was 775.

In a circular YIG thin film resonance element, the RF magnetization of $(1, 1)_1$ mode was zero at the position of $r/R = 0.8$.

Figure 20:
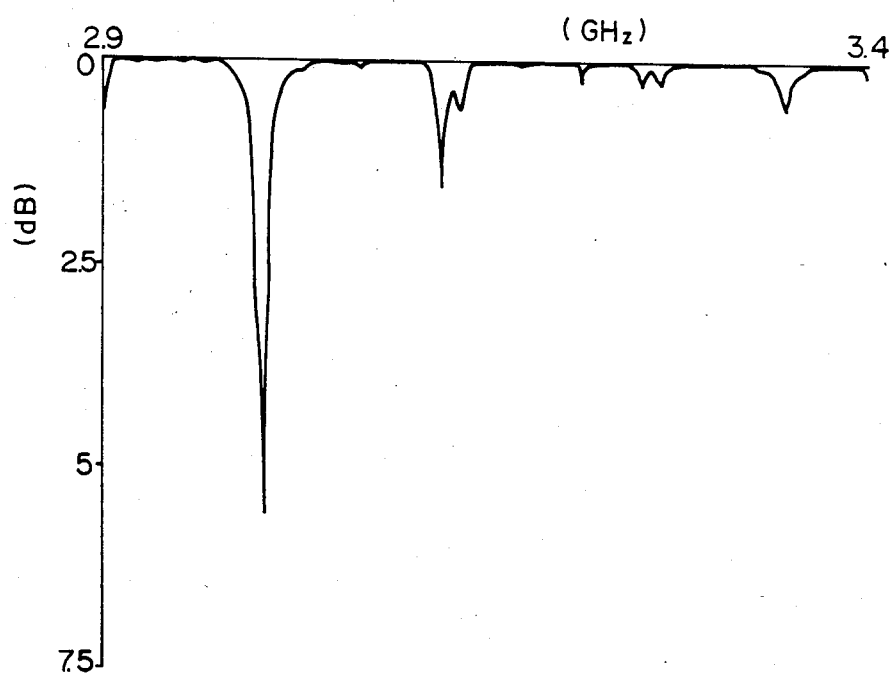
FIG. 20 is a graph illustrating insertion loss in a comparison example.

On the contrary, the YIG thin film element of film thickness 20 μm and radius 1 mm without a groove was produced from the same YIG thin film, and the ferromagnetic resonance regarding the specimen was measured using micro strip lines. The measuring results of the insertion loss were obtained as shown in FIG. 20. The unloaded Q value was 660. As clearly understood from comparison of both cases, the invention can suppress excitation of magnetostatic mode other than $(1, 1)_1$ mode and also suppress the spurious response. Since the main resonance mode is not deteriorated, the unloaded Q value is not deteriorated.

Figure 21:
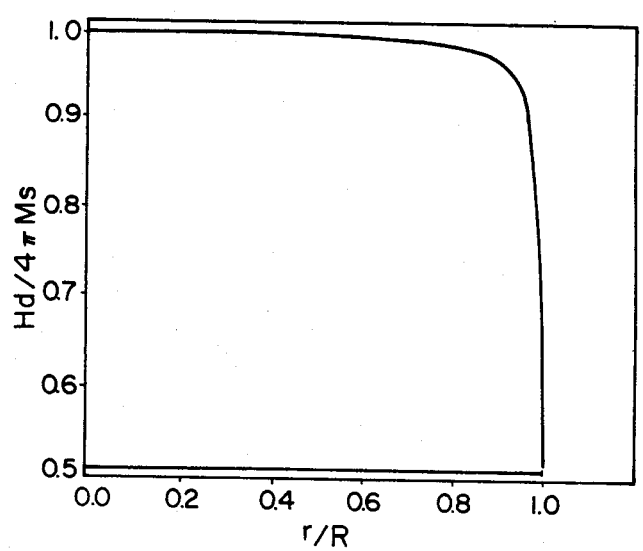
FIGS. 21 and 22 are graphs illustrating distribution of demagnetizing field in the circular ferrimagnetic thin film.
Figure 22:
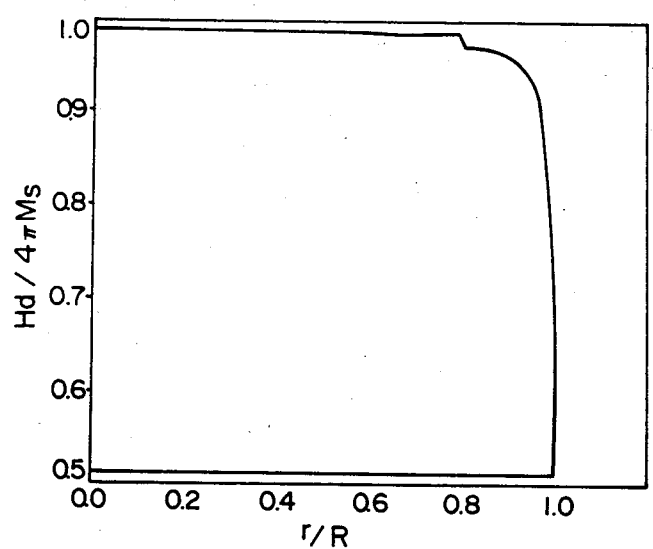

In order to suppress excitation of magnetostatic mode to prevent spurious response in a magnetic resonance element by YIG thin film, i.e. ferrimagnetic thin film, the inside region of the ferrimagnetic thin film may be made thinner than the outside region. Such construction will now be described. If a d.c. magnetic field Ho is applied in a perpendicular direction to the film surface of the disk shaped YIG thin film of thickness t and diameter D (radius r), the internal d.c. magnetic field Hi becomes Hi=Ho—Hd(r/R)—Ha. Wherein Hd is the demagnetizing field, and Ha is the anisotropic magnetic field. The aspect ration t/D is sufficiently small and distribution of the magnetic field in the specimen thickness direction is neglected. FIG. 21 shows the calculated value of the demagnetizing field Hd of the YIG disk of radius 1 mm. Since the demagnetizing field is large at the inside of the disk and abruptly becomes small at the periphery, the internal d.c. magnetic field is small at a portion near the center and abruptly becomes large near the periphery. On the contrary, FIG. 22 shows the calculated value of the demagnetizing field of the YIG thin film where the film thickness within region of inside radius 0.8 mm is made thinner by 1 μm. It is seen from the figure that as the film thickness at the inside region is made a little thinner the demagnetizing field is a little elevated at a portion near the periphery of the thinned region and the flat region of the demagnetizing field is enlarged.

Figure 23:
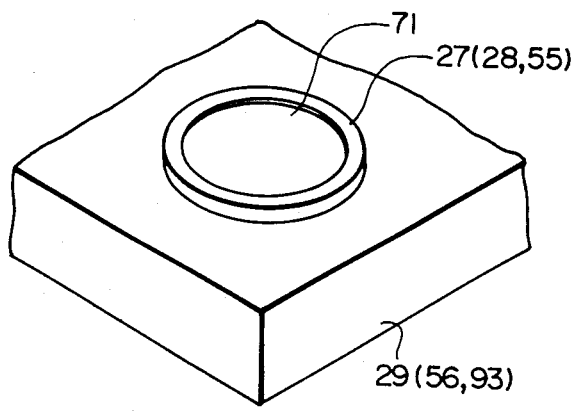
FIG. 23 is a perspective view of a magnetic resonance element.

Consequently, if the inside region of the YIG thin film element is made thinner than the outside region, the flat region of the demagnetizing field in the inside region can be enlarged thereby the magnetostatic mode to which causes spurious response can be suppressed. As shown in FIG. 23, the ferrimagnetic YIG thin film element 27, 28 or 55 is formed on the GGG substrate 29, 56 or 93. A recess 71 is formed on the YIG thin film element 27, 28 or 55 thereby the inside region is made thinner than the outside region. The thickness of the YIG thin film element 27, 28 or 55 is made sufficiently small so that the distribution of the magnetic field in the thickness direction becomes uniform. The magnetostatic mode is $(1, N)_1$ mode.

The recess 71 is extended to a position where the excitation of the magnetostatic mode which causes the spurious response is sufficiently suppressed. It is preferably extended to a position where the amplitude of $(1, 1)_1$ mode becomes zero. For example, if the YIG thin film is disk shaped, the recess is extended to a position of (0.75–0.85) times as large as the radius.

Figure 24:
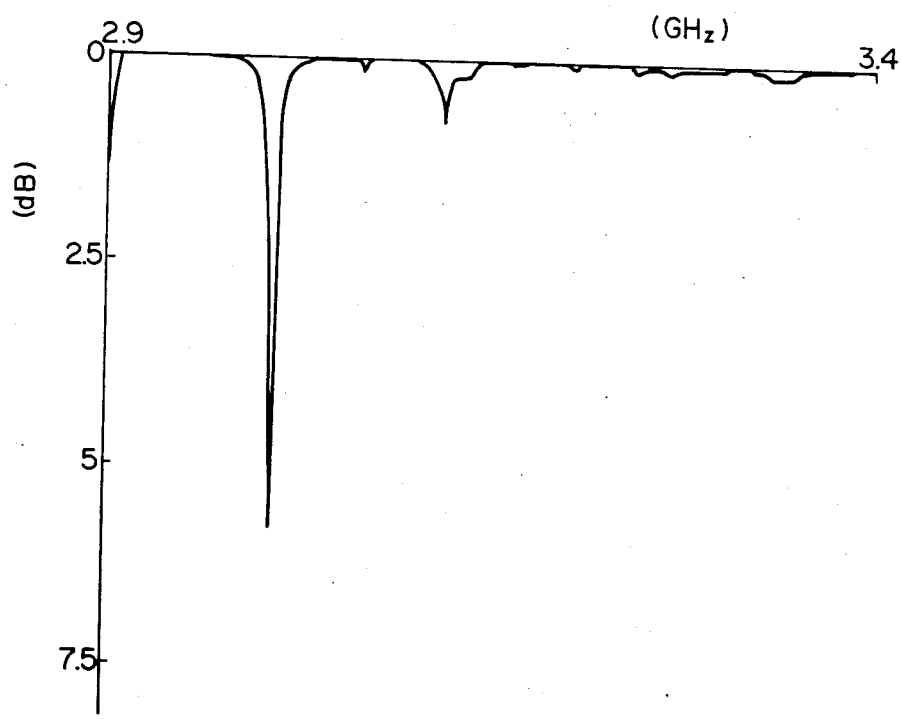
FIG. 24 is a graph illustrating insertion loss of the magnetic resonance element.

In this connection, the YIG thin film magnetic resonance element of film thickness 20 μm and radius 1 mm was formed and a circular recess 71 of depth 1.7 μm and radius 0.75 mm was formed on the resonance element in concentric relation, and the ferromagnetic resonance of the specimen was measured using micro strip lines, and the measuring results of the insertion loss were obtained as shown in FIG. 24. The unloaded Q value was 865.

The resonance frequency of a magnetic resonance element such as YIG thin film element is dependent on the saturation magnetization of the element and therefore affected directly by the temperature characteristics of the saturation magnetization. If the resonance frequency of the YIG thin film elements 27 and 28 in the high-frequency filter circuit 2 is varied depending on the variation of the ambient temperature, the frequency will get out of tune. Consequently, the YIG thin film element in the filter circuit 2 and the YIG thin film element in the local oscillator to hold a definite offset frequency are preferably held to the resonance frequency irrespective of the ambient temperature. In order to hold the resonance frequency $f_o$ of the YIG thin film in vertical resonance irrespective of the temperature T, the element may be disposed in a thermostat so as to hold the element itself to a constant temperature or a prescribed d.c. magnetic field, which depends on the resonance frequency $f_o$, may be applied so as to supply a variable amount of the magnetic field matched to a variable amount of the saturated magnetization $4\pi M_s$ [gauss] of the YIG depending on the temperature. If the YIG element is disposed at the magnetic gap in the magnetic circuit, the magnetic field $H_g$ in the magnetic gap becomes $$H_g(T) = \frac{f_o}{\gamma} + N_{zy} \cdot 4\pi M_{sy}(T) \tag{8}$$

wherein $N_{zy}$: is the demagnetizing factor, Y: is the gyromagnetic ratio. Consequently, if the $H_g(t)$ is varied to match the saturation magnetization $4\pi M_{sy}(T)$ of the YIG varying corresponding to the variation of the temperature T, the resonance frequency $f_o$ can be held constant. In order to vary the magnetic field corresponding to the temperature variation of the YIG element, an electromagnet may be used or the combination of a permanent magnet and a soft magnetic plate may be used.

In the case of using the electromagnet and also using the thermostat, however, current control is performed by an external energy supply and therefore the construction becomes complicated.

Figure 25:
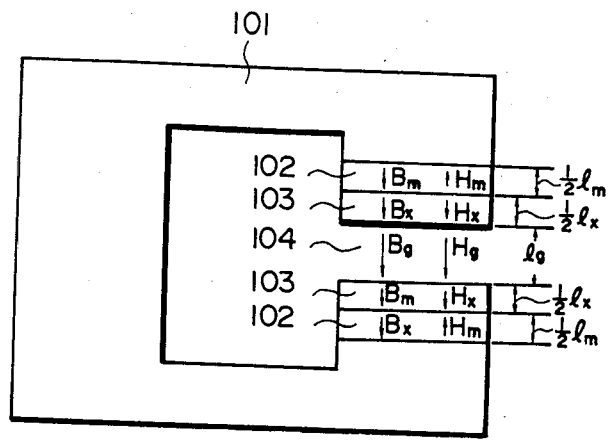
FIG. 25 is a diagram illustrating schematic constitution of a magnetic circuit.

One method to control the temperature characteristics of the gap magnetic field $H_g$ by combination of the permanent magnet and the soft magnetic plate is that the temperature characteristics of the gap magnetic field $H_g$ are designed by superposition of the temperature characteristics of the used permanent magnet and temperature characteristics of magnetization of the soft magnetic plate to match the temperature characteristics of a ferromagnetic resonance element such as YIG element, thereby temperature dependence of the resonance frequency of the element is compensated and the resonance frequency $f_o$ is held constant in the wide temperature range. Referring to FIG. 25, each of the opposite ends of a C-shaped yoke 101 has a permanent magnet 102 and a soft magnetic plate 103 formed of soft magnetic alloy or ferrite. A magnetic gap 104 of distance $l_g$ is formed between both of the soft magnetic plates 103 so as to constitute a magnetic circuit. Wherein $l_m$: is the sum of thickness of both magnets 102, $l_x$: is the sum of the thickness of both soft magnetic plates 103, $B_m$ and $H_m$: are the magnetic flux density and magnetic field within the magnet 102, $B_x$ and $H_x$: are the magnetic flux density within the soft are the magnetic plates 103, $B_g$ and $H_g$: magnetic flux density and magnetic field within the magnetic gap 104. Since the permanent magnet 102 is situated in the demagnetizing field, the magnetic field $H_m$ is in reverse direction to the magnetic flux density $B_m$. The following description is in the c.g.s unit system. Maxwell's equations regarding magnetic flux density and magnetic field in such magnetic circuit are expressed as follows:

$$\int\int\int_v div\, \mathbb{B} \cdot d_w = \int\int_s \mathbb{B} \cdot d_s = 0 \tag{9}$$

$$\int\int_s rot\, \mathbb{H} \cdot d_s = \oint_c \mathbb{H} \cdot d_l = 0 \tag{10}$$

Assuming that the magnetic field and the magnetic flux density within the magnet and the soft magnetic plate are uniform and there is no leakage of the magnetic flux these circumstances, equations (9) and (10) are expressed as follows:

$$B_m = B_x = B_g \tag{11}$$

$$l_m \cdot H_m = l_g \cdot H_g + l_x \cdot H_x \tag{12}$$

If the intensity of magnetization of the soft magnetic plate is $4\pi M_x$, the internal magnetic field $H_x$ of the soft magnetic plate is expressed by the following formula. If the internal magnetic field of the soft magnetic plate is sufficiently strong, $4\pi M_x$ in the following formula becomes the saturated magnetization $4\pi M_{sx}$.

$$H_x = H_g - N_{zx} \cdot 4\pi M_{sx} \tag{13}$$

Wherein $N_{zx}$ is the demagnetization factor, and if the soft magnetic plate is a thin disk of diameter $D_s$ and thickness $S(=\frac{1}{2}l_x)$, $N_{zx}$ is approximately expressed as follows:

$$N_{zx} = 1 - \frac{S/D_s}{\{1 - (S/D_s)^2\}^{\frac{1}{2}}} \tag{14}$$

Substituting formula (13) in formula (12), the gap magnetic field $H_g$ is expressed by the following formula.

$$H_g = \frac{l_m \cdot H_m + l_x N_{zx} \cdot 4\pi M_{sx}}{l_g + l_x} \tag{15}$$

Wherein $N_{zx}$: is the demagnetization factor of the soft magnetic plate. Consequently, using the internal magnetic field $H_m(T)$ of the magnet and the intensity of magnetization $4\pi M_{sx}(T)$ of the soft magnetic plate at the temperature T, the gap magnetic field $H_g$ as function of the temperature T is expressed by the following formula.

$$H_g(T) = \frac{l_m \cdot H_m(T) + l_x \cdot N_{zx} \cdot 4\pi M_{sx}(T)}{l_g \, l_x} \tag{16}$$

Figure 26:
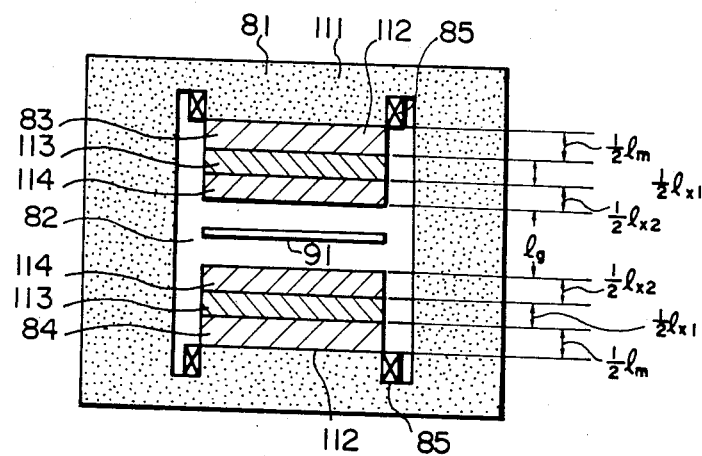
FIG. 26, FIG. 27 and FIG. 30 are diagrams illustrating schematic constitution of magnetic circuits to be applied to the invention.

Consequently, in formula (16), if the characteristics and size of the magnet 102, i.e. $H_m$ and $l_m$, and characteristics and size of the soft magnetic plate, i.e. $4\pi M_x$, $N_{zx}$ and $l_x$, and the gap distance $l_g$ are selected, the most suitable $H_g$ can be obtained. The composition and sintering condition of the material for the soft magnetic plate 103, such as ferrite or composition of alloy is selected, or the soft magnetic plate is formed by two kinds or more. However, even if the composition of the soft magnetic plate and the manufacturing conditions such as sintering condition are selected as above described, it is quite difficult in practice to cause the temperature characteristics including inclination and curvature to coincide with the desired temperature characteristics. Consequently, the resonance frequency $f_o$ of the ferromagnetic resonance element such as YIG element cannot be held constant over wide temperature range. On the other hand, the compensation of the temperature dependence in the YIG resonance element is possible in a process where the magnetic circuit which supplies the d.c. magnetic field to the YIG resonance element, for example, the magnetic yoke 81 described in FIG. 11 through FIG. 13, is assembled with material having similar composition and preferably the same composition as that of the YIG thin film element, that is, material whose temperature characteristics are the same as or similar to that of the YIG thin film element. Such construction will be described referring to FIG. 26 and FIG. 27. In a yoke 81 of this case, magnetic poles 83 and 84 to constitute a magnetic gap 82 in which the YIG thin film element is arranged have special construction. More specifically, magnets 112 are attached to opposite sides of the yoke 81, and first and second soft magnetic plates 113 and 114 having different composition than that of the magnet 112 are attached to respective magnets 112. In an example of FIG. 26, the first and second soft magnetic plates 113 and 114 are arranged to each of both sides with respect to the magnetic gap 82. In an example of FIG. 27, the first and second soft magnetic plates 113 and 114 are arranged respectively at both sides with respect to the magnetic gap 82.

Figure 27:
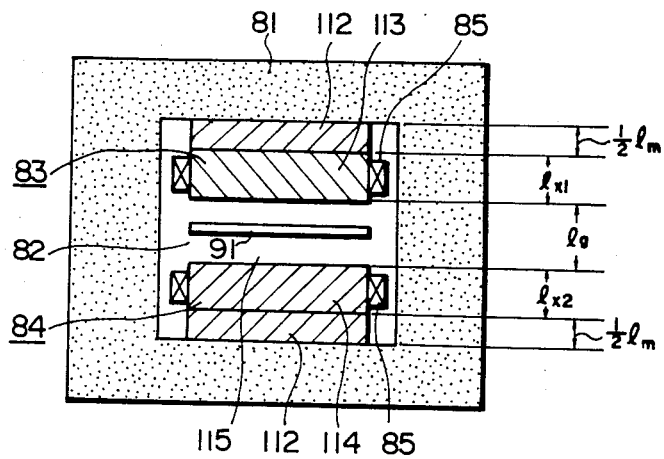
Figure 28:
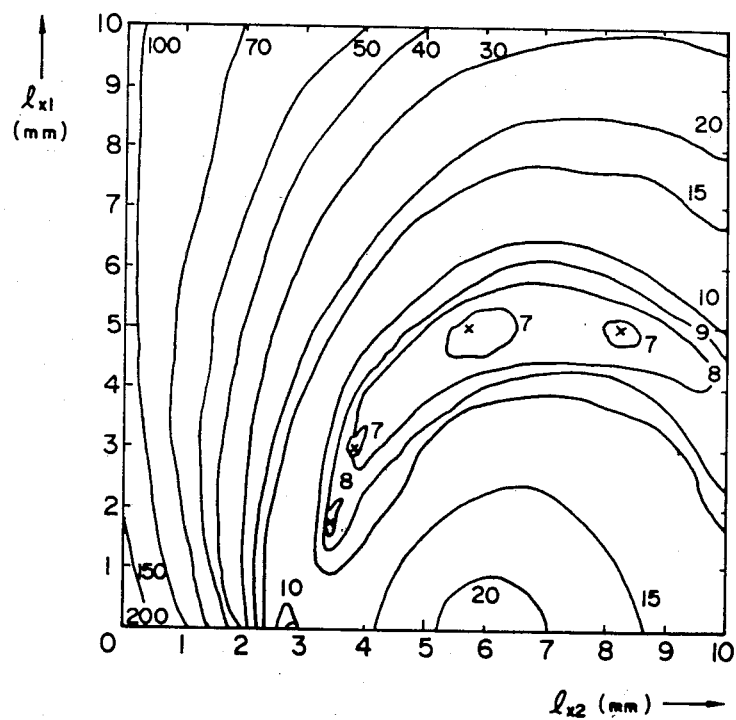
FIG. 28 and FIG. 29 are diagrams illustrating relation between the magnetic adjuster and temperature variation of the resonance frequency.

One soft magnetic plate, e.g. the first soft magnetic plate 113, is made of YIG plate having the same composition as that of the YIG element, and the other soft magnetic plate, e.g. the second soft plate plate 114, is made of another magnetic substance such as ferrite plate. In FIG. 27, when the first soft magnetic plate 113 is made of YIG and the second soft magnetic plate 114 is made of Mg.Mn.Al ferrite, and the magnet 112 is a permanent magnet of SmCo$_5$ with diameter 30 mm (residual magnetic flux density Br=8134G, coercive force H$_c$=7876O$_e$, temperature coefficient $\alpha$=−0.0005, exponential temperature characteristics), and the distance of the magnetic gap 82 is made l$_g$=2 mm and the YIG thin film element of diameter 2 mm and thickness 20 μm is disposed within the gap 82, energizing of the coil 85 was interrupted and thickness l$_m$ of the magnet 112 was selected so that the resonance frequency f$_o$ becomes f$_o$=3 GHz and the YIG thin film element was resonated. When the ambient temperature was varied in the range of −20° C.−+60° C., frequency deviation $\Delta$f (±MHz) to the resonance frequency f$_o$ relating to thickness l$_{x1}$ and l$_{x2}$ of the first and second soft magnetic plates 113 and 114 was measured as shown in FIG. 28 where points having the same frequency deviation $\Delta$f are connected in equi-value line. In FIG. 28, the numeral written on each equi-value line represents value of $\Delta$f (±MHz). In FIG. 28, the ordinate represents thickness l$_{x1}$ of the first soft magnetic plate 113, and the abscissa represents the thickness $_{x2}$ of the second soft magnetic plate 114. It is clearly seen from FIG. 28 that use of two sorts of the soft magnetic plates can reduce the temperature dependence of the resonance frequency in comparison to use of single soft magnetic plate as described in FIG. 25. Table 1 shows values regarding thickness l$_m$ of the magnet, thickness l$_{x1}$ of the YIG soft magnetic plate, thickness l$_{x2}$ of the ferrite soft magnetic plate and frequency deviation $\Delta$f.

TABLE 1

| l$_m$(mm) | l$_{x1}$(mm) | l$_{x2}$(mm) | $\Delta$f(±MHz) |
|---|---|---|---|
| 3.25 | 3.00 | 3.81 | 6.381 |
| 5.75 | 5.04 | 8.24 | 6.703 |

TABLE 1-continued

| l$_m$(mm) | l$_{x1}$(mm) | l$_{x2}$(mm) | $\Delta$f(±MHz) |
|---|---|---|---|
| 4.60 | 4.99 | 5.66 | 6.143 |
| 2.80 | 1.82 | 3.44 | 7.104 |
| 2.13 | 0 | 2.83 | 9.397 |

Figure 29:
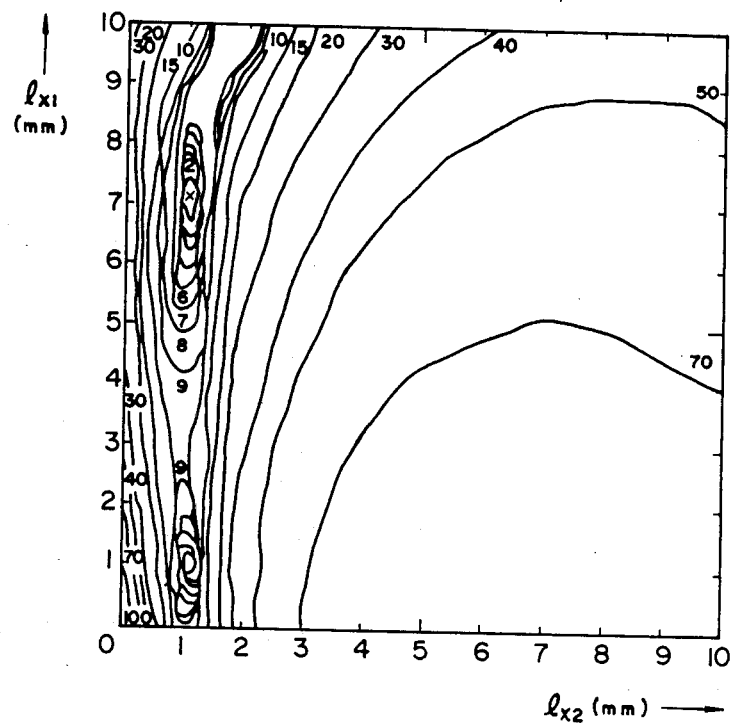

When similar construction as to the above example was made and the magnet 112 was a permanent magnet of CeCo$_5$ (Br=6250G, H$_c$=6250Oe, $\alpha$=−0.0009, approximately linear temperature characteristics), the frequency deviation $\Delta$f relating to thickness l$_{x1}$ and l$_{x2}$ of the first and second soft magnetic plates 113 and 114 was measured as shown in FIG. 29. For example, if l$_m$=2.44 mm, l$_{x1}$=0.89 mm and l$_{x2}$=0.98 mm, $\Delta$f= becomes $\Delta$f=2.160 MHz. If l$_m$=5.11 mm, l$_{x1}$=7.10 mm and l$_{x2}$=0.95 mm, $\Delta$f becomes $\Delta$f=0.786 MHz. In this case, too, $\Delta$f can be decreased by a combination of the ferrite soft magnetic plate and the YIG soft magnetic plate. This example having the magnet 3 of $\alpha$=−0.0009 can decrease $\Delta$f well in comparison to the previous example of $\alpha$=−0.0005.

Figure 30:
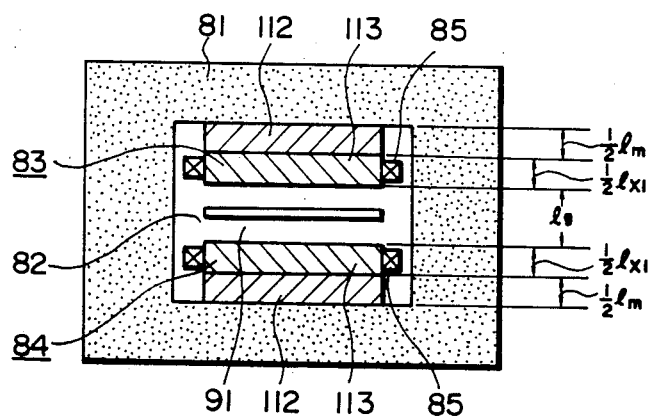

Further, when the magnet 112 was a permanent magnet of $\alpha$=−0.001 (Br=6300G, H$_c$=5500Oe, linear temperature characteristics) and only the first soft magnetic plate 113 of YIG was used as shown in FIG. 30, if l$_m$=3.281 mm and l$_{x1}$=3.857 mm, $\Delta$f becomes $\Delta$f=2.224 MHz.

In conclusion, as the temperature coefficient of the permanent magnet 112 approaches the average temperature coefficient −0.00128 estimated by formula (8), frequency deviation $\Delta$f, i.e. temperature dependence can be reduced when the soft magnetic plates is constituted by YIG only. When two sorts of soft magnetic plates are used, f can be reduced if one of the soft magnetic plates is made of the same material as that of the magnetic resonance element.

The temperature dependence of the resonance frequency can be reduced if the same YIG as that of the magnetic resonance thin film element is used in a soft magnetic plate as above described. This constitution will be described.

In order to realize the ideal state that the temperature dependence becomes 0, the formula (8)

$$H_g(T) = \frac{f_o}{\gamma} + N_{zy} \cdot 4\pi M_{sy}(T) \quad (17)$$

and the formula (16)

$$H_g(T) = \frac{l_m H_m(T) + l_x \cdot N_{zx} \cdot 4\pi M_{sx}(T)}{l_g l_x}$$

must be equal. Hence $$\frac{f_o}{\gamma} + N_{zy} \cdot 4\pi M_{sy}(T) = \frac{l_m}{l_g + l_x} H(T) + \frac{l_x}{l_g + l_x} N_{zx} \cdot 4\pi M_{sx}(T)$$

If temperature coefficient of the permanent magnet is quite small and H$_m$(T) is made the constant value H$_{mo}$, it follows that $$\frac{f_o}{\gamma} + N_{zy} \cdot 4\pi M_{sy}(T) = \frac{l_m}{l_g + l_x} H_{mo} + \frac{l_x}{l_g + l_x} N_{zx} \cdot 4\pi M_{sx}(T) \quad (18)$$

In order that both sides are always equal, the constant terms must be equal and the temperature dependent terms be equal respectively. Hence $$\frac{f_o}{\gamma} = \frac{l_m}{l_g + l_x} H_{mo} \tag{19}$$

$$N_{zy} \cdot 4\pi M_{sy}(T) = \frac{l_x}{l_g + l_x} N_{zx} \cdot 4\pi M_{sx}(T) \tag{20}$$

From formula (19), it follows that $$H_{mo} = \frac{l_g + l_x}{l_m} \cdot \frac{f_o}{\gamma} \tag{21}$$

Since the YIG element and the soft magnetic plate are sufficiently thin and therefore $N_{zy}$ and $N_{zx}$ become approximately 1 respectively, formula (20) becomes $$4\pi M_{sy}(T) = \frac{l_x}{l_g + l_x} 4\pi M_{sy}(T) \tag{22}$$

Further, assuming that $l_g \ll l_x$, it follows that $l_x/l_g + l_x \sim 1$ and formula (20) becomes $$4\pi Msy(T) = 4\pi Msx(T) \tag{23}$$

Consequently, if the characteristics of the permanent magnet 113 are constant irrespective of temperature and distance $l_g$ of the magnetic gap 82 is sufficiently small, the soft magnetic plate to equalize formula (8) and formula (15) is YIG as constituting material of the magnetic resonance element itself.

Next, the description is given for the case where the permanent magnet has a temperature coefficient $\beta$ and YIG is the material of the magnetic resonance element which is used in and the soft magnetic plate the temperature characteristics will be good.

When YIG is used in the soft magnetic plate, formula (17) is obtained by equalizing formula (8) and formula (16), and further $N_{zx}$, $N_{zy} \sim 1$. Consequently, formula (17) is solved regarding $H_m(T)$ as follows:

$$H_m(T) = \frac{l_g + l_x}{l_m} \cdot \frac{f_o}{\gamma} + \frac{l_g}{l_m} \cdot 4\pi M_{sy}(T) \tag{24}$$

Figure 31:
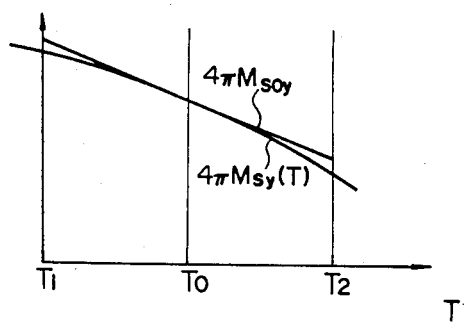
FIG. 31 and FIG. 32 are diagrams illustrating characteristics of a magnetic circuit.

Referring to FIG. 31, if the temperature characteristics of the saturation magnetization are represented by line approximately using the average temperature coefficient $\alpha$ in the noticed temperature range $T_1 \sim T_2$, it follows that $$4\pi Msy(T) = 4\pi Msoy\{1 + \alpha(T - To)\} \tag{25}$$

Substituting formula (25) in formula (24), $$H_m(T) = \frac{l_g + l_x}{l_m} \cdot \frac{f_o}{\gamma} + \frac{l_g}{l_m} \cdot 4 M_{soy} \frac{l_g}{l_x} \cdot 4\pi M_{soy} \alpha(T - To) \tag{26}$$

Hence $$H_m(T) = H_{mo}\{1 + \beta(T - To)\} \tag{27}$$

wherein $$H_{mo} = \frac{\{(l_g + l_x) f_o/\gamma\} + l_g \cdot 4\pi M_{soy}}{l_m} \tag{28}$$

$$\beta = \frac{l_g \cdot 4\pi M_{soy}}{\{(l_g + l_x) f_o/\gamma\} + l_g \cdot 4\pi M_{soy}} \cdot \alpha \tag{29}$$

$$= \frac{4\pi M_{soy}}{\{(1 + l_x/l_g) f_o/\gamma\} + 4\pi M_{soy}} \cdot \alpha$$

If the permanent magnet has linear temperature characteristics and the temperature coefficient is $\beta$, in order that formula (29) is satisfied, following formula is selected.

$$l_x/l_g = \frac{(\alpha - \beta) 4\pi M_{soy}}{\beta \cdot f_o/\gamma} \tag{30}$$

Further, in order that formula (28) is satisfied, following formula is selected corresponding to strength $H_{mo}$ of the permanent magnet.

$$l_m \cdot H_{mo} = \{(l_g + l_x) f_o/Y\} + l_g \cdot 4\pi Msoy \tag{31}$$

Then the gap magnetic field H(T) becomes $$H_g(T) = \frac{l_m}{l_g + l_x} H_m(T) + \frac{l_x}{l_g + l_x} 4\pi M_{sy}(T) \tag{32}$$

$$= \frac{l_m}{l_g + l_x} H_{mo}\{1 + \beta(T - To)\} + \frac{l_x}{l_g + l_x} 4\pi M_{sy}(T)$$

$$= \frac{l_m}{l_g + l_x} \frac{l_g + l_x}{l_m} \cdot \frac{f_o}{\gamma} + \frac{l_g}{l_m} \cdot 4\pi M_{soy} +$$

$$\frac{l_g}{l_m} \cdot 4\pi M_{soy} \cdot \alpha(T - To) + \frac{l_x}{l_g + l_x} \cdot 4\pi M_{sy}(T)$$

$$= \frac{f_o}{\gamma} + \frac{l_g}{l_g + l_x} \cdot 4\pi M_{soy} 1 + \alpha(T - To) +$$

$$\frac{l_x}{l_g + l_x} \cdot 4\pi M_{sy}(T)$$

On the other hand, when $N_{zy} \sim 1$, the resonance frequency f becomes $$f = Y\{H_g(T) - 4\pi Msy(T)\} \tag{33}$$

From formulae (32) and (33), $\Delta f = f - f_o$ becomes $$\Delta f = \frac{\gamma l_g}{l_g + l_x} [4\pi M_{soy}\{1 + \alpha(T - To)\} - 4\pi M_{sy}(T)] \tag{34}$$

Figure 32:
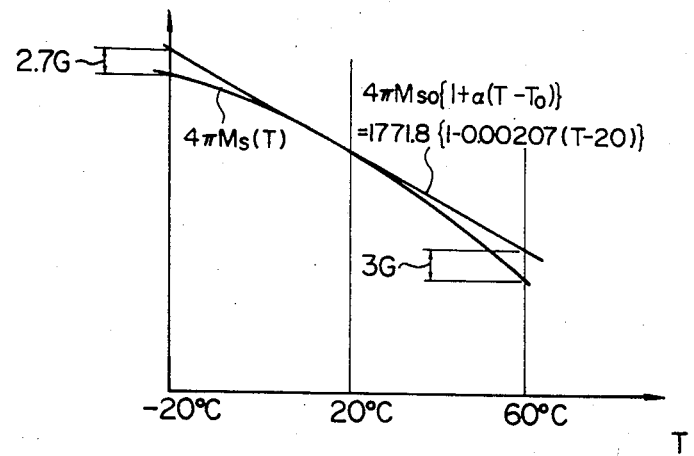

That is, $\Delta f$ is the shift of $4\pi M_{sy}$ from the linear approximation, multiplied by $l_g/l_g + l_x$ times and further multiplied by Y. Consequently, $\Delta f$ becomes quite small. For example, as shown in FIG. 32, at $-20°$ C. the measured value is 1915.8 G and the value by linear approximation is 1918.5 G, thereby the shift is as small as about 2.7 G; at $+60°$ C. the measured value is 1622.1 G and the value by linear approximation is 1625.1 G, thereby the shift is as small as 3.0 G. Assuming that $l_g/l_g + l_x = 0.2$ and $Y = 2.8$, it follows that $$\Delta f = 2.8 \times 0.2 \times 3.0 = 1.68 \text{ MHz}$$

That is, $\Delta f$ becomes as small as 0.84 MHz.

Thus, it is understood that if YIG is used in the soft magnetic plate the magnetic apparatus can be formed with excellent temperature characteristics hence with good compensation to the temperature dependence.

When this construction is applied to a signal converter of the invention in practice, the coil 85 is variably energized and magnetic field by the coil 85 is superposed with magnetic field by the magnet 112 and in some cases together with the auxiliary coil 87, the magnet 86 and the like, thereby the superposed magnetic field sets the resonance frequency or tuning frequency.

Although any of above examples uses the soft magnetic plate of one or two sorts of constituting materials, three sorts of constituting materials or more may be used.

A signal converter of the invention is not restricted to a tuner of a superheterodyne type as described in FIG. 1, but other construction such as a tuner of a double superheterodyne type may be used. An example of this construction will be described referring to FIG. 33. Numeral 201 designates an antenna, numeral 202 a high-frequency amplifier, numeral 203 a first mixer, numeral 204 a first local oscillator using a ferromagnetic resonator including a YIG resonator element, numeral 205 a filter circuit including ferromagnetic resonator such as YIG resonator element, numeral 206 a second mixer, numeral 207 a second local oscillator also using a ferromagnetic resonator including a YIG resonator element, and numerals 208, 209 and 210 magnetic field applying means to the YIG resonator elements of the first local oscillator 204, the second local oscillator 207 and the filter circuit 205, respectively. The magnetic field applying means 208 is variably formed so that the oscillation frequency of the first local oscillator 204 can be variably set. Other magnetic field applying means 210 and 209 supply fixed magnetic fields so that the pass frequency (center frequency) $f_F$ of the filter circuit 205 is set and the oscillation frequency $f_{L2}$ of the second local oscillator 207 is set to have a prescribed offset frequency. If the antenna 201 receives a signal of frequency $f_{so}$, e.g. frequency $f_{so}=90\sim900$ MHz, the received signal is amplified by the amplifier 202 and introduced to the first mixer 203 and mixed by the mixer with the oscillation signal of frequency $f_{L1}$, e.g. $f_{L1}=2100$ and a frequency of 2910 MHz from the first local oscillator 204, thereby signal converted in frequency $f_{so1}(f_{so1}=f_{so}+f_{L1})$ and is taken out. Among the signals taken out from the first mixer 203, a signal of intermediate frequency $f_F$ is the frequency set in the filter circuit 205, e.g. $f_F=3$ GHz, is taken out from the filter circuit 205 and introduced to the second mixer 206 and mixed by the mixer with an oscillation signal of frequency $f_{L2}$, e.g. $f_{L2}=2942$ MHz from the second local oscillator 207, thereby a signal of frequency $f_{1F}(f_{LF}=f_F-f_{L2})$, e.g. $f_{1F}=58$ MHz is taken out. That is, the oscillation frequency $f_{L1}$ of the first local oscillator 204 is selected by adjusting the magnetic field applying means 208, thereby a signal of a prescribed frequency is taken out from the received signal. For example, if the oscillation frequency $f_{L1}$ of the first local oscillator 204 is selected to be 2600 MHz, a receiving signal of $f_F-f_{L1}=3000-2600=400$ (MHz) can be tuned.

In such circuit construction, too, magnetic resonance elements such as a YIG element for the first local oscillator 204, the second local oscillator 207 and the filter circuit 205 are formed by the thin film forming method. The YIG thin film magnetic resonance elements are made of the same material and set to the same shape and aspect ratio. For example, if the element is of disk shape, the ratio of the radius is set to the same value; if the element is of square or rectangular shape, the ratio of corresponding sides are set to the same value.

Thus, a receiver having excellent temperature characteristics can be formed. Consequently, compensation of the temperature characteristics by arranging the soft magnetic plate having the same composition as that of the YIG magnetic resonance thin film element in the magnetic circuit as described in FIG. 25 through FIG. 32 may be obviated. The temperature characteristics in such constitution will be described.

The resonance frequencies of YIG thin film resonator elements in the first local oscillator 204, the second local oscillator 207 and the filter circuit 205, that is, the oscillation frequencies $f_{L1}$ and $f_{L2}$ and the passing frequency $f_F$ of the filter circuit 205, are expressed as follows:

$$f_{L1} = \gamma(H_{ex1} - N_{z1} 4\pi M_{sy}) \tag{35}$$

$$f_{L2} = \gamma(H_{ex2} - N_{z2} 4\pi M_{sy})$$

$$f_F = \gamma(H_{exF} - N_{zF} 4\pi M_{sy})$$

Wherein $H_{ex1}$, $H_{ex2}$, $H_{exF}$ are d.c. magnetic fields to YIG thin film elements in the first and second local oscillators 204, 207 and the filter circuit 205, and $N_{z1}$, $N_{z2}$, $N_{zF}$ are demagnetizing factors of the YIG thin film resonator elements in the first and second local oscillators 204, 207 and the filter circuit 205. In this example, $H_{ex2}$ and $H_{exF}$ are fixed magnetic fields and $H_{ex1}$ is variable, and $N_{z1}$, $N_{z2}$, $N_{zF}$ are selected so that $N_{z1}=N_{z2}=N_{zF}$. When the ambient temperature varies, the saturated magnetization $4\pi M_{sy}$ of YIG as a function of temperature varies, but on account of selection in $N_{z1}=N_{z2}=N_{zF}$ the frequencies $f_{L1}$, $f_{L2}$, $f_F$ are varied by the same amount. For example, assuming that the passing frequency $f_F$ of the filter circuit 205 at the normal temperature is set to $f_F=3$ GHz, the oscillation frequency $f_{L2}$ of the second local oscillator 207 is set to 2.942 GHz, and the oscillation frequency $f_{L1}$ of the first local oscillator 204 is set to 2.6 GHz as already described for tuning to 400 MHz, if the ambient temperature rises and $M_{sy}$ is reduced by 36 Gauss and $f_F$ is increased by 0.1 GHz and $f_F$ becomes 3.1 GHz, as clearly understood from formula (35) $f_{L1}$ and $f_{L2}$ are also increased by 0.1 GHz respectively, and $f_{L1}$ becomes 2700 MHz and $f_{L2}$ becomes 3042 MHz, thereby the received signal of $f_F-f_{L1}=3100-2700=400$ (MHz) can be tuned and output of the intermediate frequency $f_{1F}=f_F-f_{L2}=3100-3042=58$ (MHz) is taken out from the second mixer 206 and the temperature does not influence the response.

Figure 33:
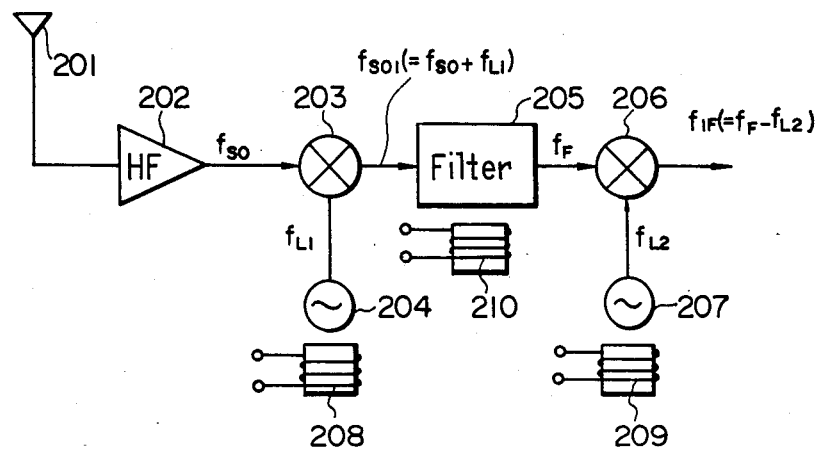
FIG. 33 and FIG. 34 are block diagrams of receivers as other embodiments of the invention.

In FIG. 33, magnetic fields applied to the filter circuit 205 and the second local oscillator 207 are fixed and magnetic field applied to the first local oscillator 204 are adjusted for the tuning. However, the magnetic field to the first local oscillator 204 may be fixed and the magnetic fields to the filter circuit 205 and the second local oscillator 207 may be adjusted in interlocking relationship for the tuning. As example of such construction will be described referring to FIG. 34. Parts in FIG. 34 corresponding to FIG. 33 are designated by the same reference numerals, and the repeated description shall be omitted. In the example, signal converted in frequency $f_{so1}=f_{so}+f_{L1}$ is taken out from a first mixer 203, and signal converted in frequency $f_{1F}=f_F+f_{L2}$ is taken out from a second mixer 206.

In this example, too, the temperature characteristics can be compensated by the circuit itself.

Figure 34:
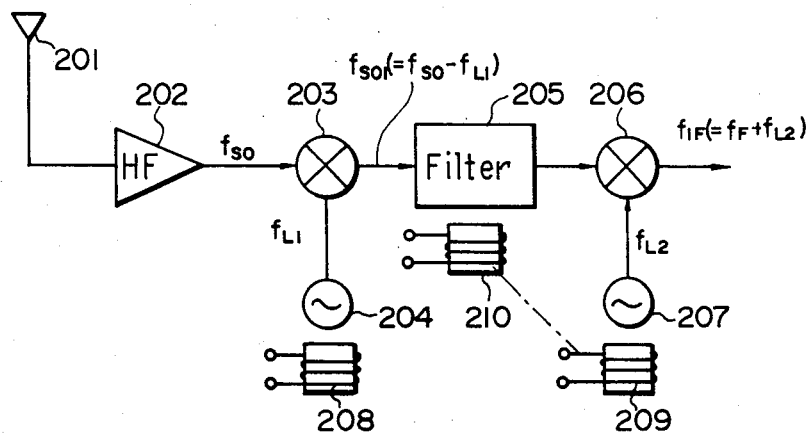

In any example of FIG. 33 and FIG. 34, specific structure of the filter circuit 205 and the first and second local oscillators 204 and 207 is similar to that of the filter circuit 2 and the local oscillator 5 in FIG. 1. The offset frequency in the filter circuit 205 and the second local oscillator 207 can be set in a similar manner to the filter circuit 2 and the local oscillator 5 in FIG. 1 where prescribed d.c. bias magnetic field is applied in superposition to the YIG element in one of the circuits.

In FIG. 33 and FIG. 34, a fixed magnetic field is applied to a part of the circuit and a variable magnetic field is applied to another part of the circuit. In this case the, YIG element or the circuit including it to supply the fixed magnetic field and other YIG element or circuit including is to supply the variable magnetic field are assembled in separate yokes 81, i.e. separate magnetic circuits, so as to generate required fixed magnetic field and variable magnetic field.

In a receiver of the invention as above described, construction of magnetic resonance elements by machining such as YIG monocrystalline bulb or YIG monocrystalline plate is avoided, and the YIG thin film elements are formed by thin film forming method such as liquid phase epitaxy, sputtering or chemical vapor deposit. Accordingly, mass production becomes easy, and the characteristics between the filter circuit and the resonator in the local oscillator can be set accurately, thereby the tracking error can be effectively prevented without installing special circuits to correct the tracking error. Consequently, the invention is advantageous in that the construction is simplified, and mass production becomes simple and the cost is reduced.

We claim as our invention:

1. A signal converter comprising:
a filter formed of a first ferromagnetic resonator supplied with a input signal to be converted and producing a filtered signal having a first frequency, a local oscillator formed of an active element and a second ferromagnetic resonator connected to said active element, and producing an oscillating signal having a second frequency,
a mixer receiving and mixing said filtered signal and said oscillating signal and producing a converted signal, said first ferromagnetic resonator formed of a first ferrimagnetic crystal, a first microstrip line magnetically coupled to said ferrimagnetic crystal and a first D.C. bias magnetic field means which directly applies a first D.C. bias magnetic field to said first ferrimagnetic crystal,
said second ferromagnetic resonator being formed of a second ferrimagnetic crystal, a second microstrip line magnetically coupled to said second ferrimagnetic crystal, and a second D.C. bias magnetic field means which directly applies a second D.C. bias magnetic field to said second ferrimagnetic crystal, said first and second ferrimagnetic crystals being composed of ferrimagnetic thin films formed by a thin film forming technique.

2. A signal converter comprising;
a first local oscillator formed of a first active element and a first ferromagnetic resonator connected to said first active element and producing a first oscillating signal having a first frequency,
a first mixer receiving and mixing said first oscillating signal and an input signal which is to be converted and producing a mixed signal, a filter formed of a second ferromagnetic resonator receiving said mixed signal and producing a filtered signal having a second frequency, a second local oscillator formed of a second active element and a third ferromagnetic resonator connected to said second active element and producing a second oscillating signal having third frequency,
a second mixer receiving and mixing said filtered signal and said second oscilating signal and producing a converted signal,
said first ferromagnetic resonator formed of a first ferrimagnetic crystal, a first microstrip line which is magnetically coupled to said ferrimagnetic crystal and first D.C. bias magnetic field means which directly applies a first D.C. bias magnetic field to said first ferrimagnetic crystal,
said second ferromagnetic resonator formed of a second ferrimagnetic crystal, a second microstrip line which is magnetically coupled to said second ferrimagnetic crystal and second D.C. bias magnetic field means which directly applies a second D.C. bias magnetic field to said second ferrimagnetic crystal,
said third ferromagnetic resonator formed of a third ferrimagnetic crystal, a third microstrip line magnetically coupled to said third ferrimagnetic crystal and a third D.C. bias magnetic field means which directly applies a third D.C. bias magnetic field to said third ferrimagnetic crystal, said first, second, and third ferrimagnetic crystals being composed of ferrimagnetic thin films formed by a thin film forming technique.

3. A signal converter according to claims 1 or 2, wherein each of said ferrimagnetic crystal is YIG thin film formed on a non magnetic substrate formed by a liquid phase epitaxial growth technique.

4. A signal converter according to claims 1 or 2 wherein each of said ferrimagnetic crystals is YIG thin film formed by liquid phase epitaxial growth technique on a non-magnetic substrate which is processed to suppress spurious responses of ferromagnetic resonance caused by magnetostatic modes other than the uniform mode.

5. A signal converter according to claims 1 or 2, wherein each of said ferrimagnetic crystal is a YIG thin disk formed by liquid phase epitaxy and has a groove at a peripheral portion of said disk.

6. A signal converter according to claims 1 or 2, wherein said ferrimagnetic crystal is a YIG thin disk formed by liquid phase epitaxy and has a thickness at a central portion of said disk which is less than the thickness at a peripheral portion of said disk.

7. A signal converter according to claim 1; wherein said filtered signal and said oscillating signal have a certain frequency offset between them.

8. A signal converter according to claim 7, wherein said first and second D.C. bias magnetic means are formed commonly for said first and second ferrimagnetic crystals and said frequency offset is caused by the difference in aspect ratio between each of said first and second ferrimagnetic crystals.

9. A signal converter according to claim 7, wherein said first and second ferrimagnetic crystals have the same aspect ratio with each other and said frequency offset is caused by the differences between said first magnetic field and said second magnetic field.

10. A signal converter according to claim 1, wherein said first and second D.C. bias magnetic fields are adjusted together.

11. A signal converter according to claim 1, wherein said first and second ferrimagnetic crystals are formed on a common non magnetic substrate.

12. A signal converter according to claim 1, wherein said first and second ferrimagnetic crystals are mounted in a common biasing magnetic circuit and said first and second D.C. bias magnetic fields are commonly formed.

13. A signal converter according to claim 2, wherein said first oscillating signal has a variable frequency which varies in accordance with a variable D.C. bias magnetic field generated by said first D.C. bias magnetic field means, and said filtered signal and said second oscillating signal have fixed predetermined frequencies with a certain frequency offset between them.

14. A signal converter according to claim 2, wherein said first oscillating signal has a fixed frequency, and said filtered signal and said second oscillating signal are commonly adjusted and have a certain frequency offset between them.

15. A signal converter according to claims 13 or 14, wherein said second and third ferromagnetic crystals are placed in a common bias magnetic circuit and said second and third D.C. bias magnetic fields are commonly formed.

16. A signal converter according to claim 13 or 14, wherein said second and third ferrimagnetic crystals are formed on a common nonmagnetic substrate.

17. A signal converter according to claims 13 or 14 wherein, said frequency offset is caused by the difference in aspect ratio between said second and third ferrimagnetic crystals.

* * * * *